United States Patent
Yamaguchi et al.

(10) Patent No.: US 10,460,854 B2
(45) Date of Patent: Oct. 29, 2019

(54) SUPERCONDUCTING WIRE

(71) Applicant: Sumitomo Electric Industries, Ltd., Osaka-shi, Osaka (JP)

(72) Inventors: Takashi Yamaguchi, Osaka (JP); Tatsuoki Nagaishi, Osaka (JP); Masaya Konishi, Osaka (JP); Kotaro Ohki, Osaka (JP); Genki Honda, Osaka (JP); Tatsuhiko Yoshihara, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 225 days.

(21) Appl. No.: 15/320,935

(22) PCT Filed: Mar. 16, 2015

(86) PCT No.: PCT/JP2015/057641
§ 371 (c)(1),
(2) Date: Dec. 21, 2016

(87) PCT Pub. No.: WO2016/017203
PCT Pub. Date: Feb. 4, 2016

(65) Prior Publication Data
US 2017/0133127 A1 May 11, 2017

(30) Foreign Application Priority Data
Jul. 31, 2014 (JP) .................. 2014-156649

(51) Int. Cl.
*H01F 6/06* (2006.01)
*H01B 12/06* (2006.01)
(Continued)

(52) U.S. Cl.
CPC ......... *H01B 12/06* (2013.01); *C01F 17/0018* (2013.01); *H01F 6/06* (2013.01);
(Continued)

(58) Field of Classification Search
None
See application file for complete search history.

(56) References Cited

U.S. PATENT DOCUMENTS

| | | | |
|---|---|---|---|
| 2013/0137579 A1 | 5/2013 | Nagasu et al. | |
| 2013/0217581 A1 | 8/2013 | Yoshizumi et al. | |

(Continued)

FOREIGN PATENT DOCUMENTS

| | | |
|---|---|---|
| CN | 1400612 A | 3/2003 |
| CN | 1596479 | 3/2005 |

(Continued)

OTHER PUBLICATIONS

U.S. Appl. No. 15/320,923, filed Dec. 21, 2016, Takashi Yamaguchi et al.
(Continued)

*Primary Examiner* — Colleen P Dunn
(74) *Attorney, Agent, or Firm* — Drinker Biddle & Reath LLP

(57) ABSTRACT

A superconducting wire includes a multilayer stack and a covering layer (stabilizing layer or protective layer). The multilayer stack includes a substrate having a main surface and a superconducting material layer formed on the main surface. The covering layer (stabilizing layer or protective layer) is disposed on at least the superconducting material layer. A front surface portion of the covering layer (stabilizing layer or protective layer) located on the superconducting material layer (front surface portion of the stabilizing layer or upper surface of the protective layer) has a concave shape.

6 Claims, 29 Drawing Sheets

(51) Int. Cl.
*H01L 39/14* (2006.01)
*H01L 39/24* (2006.01)
*C01F 17/00* (2006.01)

(52) U.S. Cl.
CPC .......... *H01L 39/143* (2013.01); *H01L 39/248* (2013.01); *C01P 2006/40* (2013.01)

(56) References Cited

U.S. PATENT DOCUMENTS

| | | |
|---|---|---|
| 2015/0038334 A1 | 2/2015 | Nagasu et al. |
| 2017/0140852 A1* | 5/2017 | Yamaguchi ............. C23C 14/08 |
| 2018/0337323 A1* | 11/2018 | Yamaguchi ............ H01B 12/06 |

FOREIGN PATENT DOCUMENTS

| | | |
|---|---|---|
| CN | 103189934 A | 7/2013 |
| JP | 2004-031128 A | 1/2004 |
| JP | 2012-169237 | 9/2012 |
| JP | 2013-012406 A | 1/2013 |
| JP | 2013-246881 A | 12/2013 |
| WO | WO 03/047006 | 6/2003 |
| WO | WO-2013/018870 A1 | 2/2013 |
| WO | WO-2013/157286 A1 | 10/2013 |

OTHER PUBLICATIONS

Notice of Allowance dated Feb. 8, 2019 that issued in U.S. Appl. No. 15/320,923.
Notice of Allowance dated Jul. 17. 2019 that issued in U.S. Appl. No. 15/320,923.

* cited by examiner

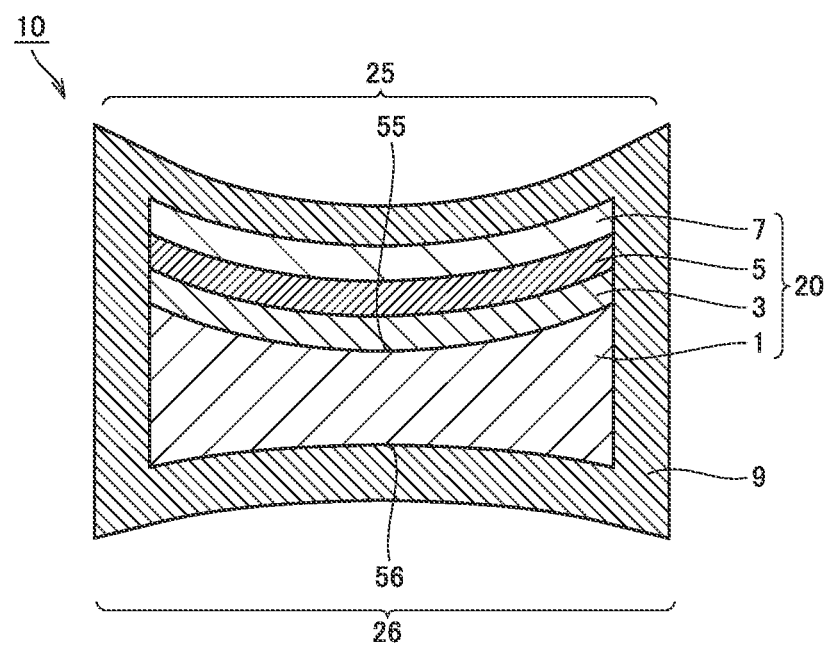

SUPERCONDUCTING WIRE

TECHNICAL FIELD

The present invention relates to a superconducting wire, and more specifically relates to a superconducting wire in which a superconducting material layer is formed on a substrate.

BACKGROUND ART

In recent years, development of a superconducting wire in which a superconducting material layer is formed on a metal substrate has been in progress. In particular, an oxide superconducting wire is of interest which includes a superconducting material layer made of an oxide superconductor which is a high-temperature superconductor having a transition temperature equal to or more than the liquid nitrogen temperature.

Such an oxide superconducting wire is generally manufactured by forming an intermediate layer on an orientation-aligned metal substrate, forming an oxide superconducting material layer on the intermediate layer, and further forming a stabilizing layer of silver (Ag) or copper (Cu) (see for example Japanese Patent Laying-Open No. 2013-12406 (PTD 1)).

CITATION LIST

Patent Document

PTD 1: Japanese Patent Laying-Open No. 2013-12406

SUMMARY OF INVENTION

Technical Problem

The superconducting wire configured in the above-described manner is wound in a coil shape to form a superconducting coil, for example. At this time, the surface of the wound superconducting wire (particularly the surface of a stabilizing layer on the side where a superconducting material layer is formed) may contact the superconducting wire superposed on this surface or contact another part and may accordingly be damaged. In this case, this damage of the surface may also cause the superconducting material layer in the superconducting wire to be damaged, leading to deterioration of the properties of the superconducting wire.

The present invention has been made to solve the problem as described above. An object of the present invention is to provide a superconducting wire in which deterioration of the superconducting properties can be suppressed.

Solution to Problem

A superconducting wire according to an aspect of the present invention includes a multilayer stack and a covering layer. The multilayer stack includes a substrate having a main surface, and a superconducting material layer formed on the main surface. The covering layer is disposed on at least the superconducting material layer. The covering layer located on the superconducting material layer has a front surface portion in a concave shape.

Advantageous Effects of Invention

According to the foregoing, the front surface portion of the covering layer of the superconducting wire has a concave shape. Therefore, the possibility that another part or the like superposed on the front surface portion contacts the concave region of the front surface portion can be reduced. Therefore, deterioration of the super conducting properties due to this contact can be suppressed.

BRIEF DESCRIPTION OF DRAWINGS

FIG. 29 is a schematic cross-sectional view for illustrating a superconducting wire in the ninth embodiment of the present invention.

DESCRIPTION OF EMBODIMENTS

Description of Embodiments of the Invention

Figure 1:
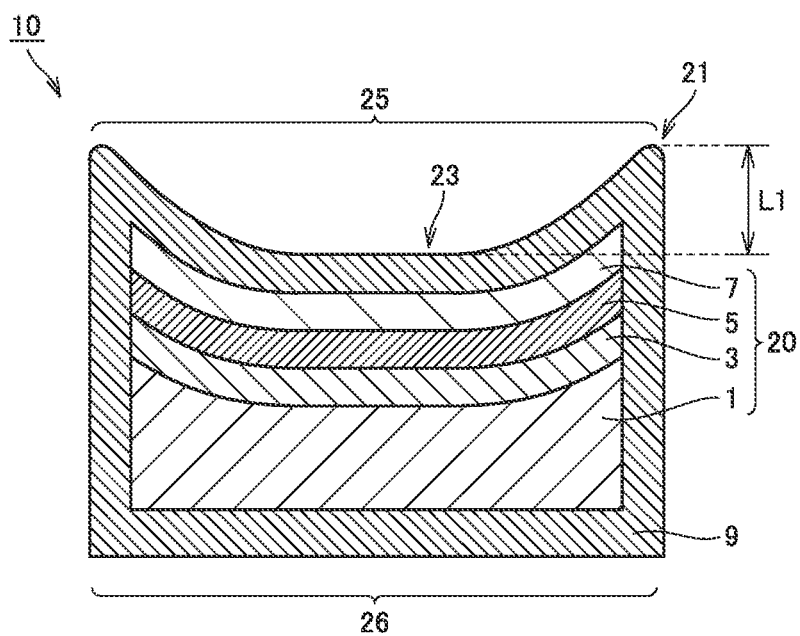
FIG. 1 is a schematic cross-sectional view showing a configuration of a superconducting wire in a first embodiment of the present invention.

Initially, aspects of the present invention will be described one by one.

(1) A superconducting wire 10 in an aspect of the present invention (see FIG. 1) includes: a multilayer stack 20 and a covering layer (stabilizing layer 9 or protective layer 7). Multilayer stack 20 includes a substrate 1 having a main surface, and a superconducting material layer 5 formed on the main surface. The covering layer (stabilizing layer 9 or protective layer 7) is disposed on at least superconducting material layer 5. The covering layer (stabilizing layer 9 or protective layer 7) located on superconducting material layer 5 has a front surface portion (a front surface portion 25 of stabilizing layer 9 or the upper surface of protective layer 7) in a concave shape. Above-described superconducting material layer 5 may be formed directly on the main surface of substrate 1 or indirectly thereon with an intermediate layer 3 or the like interposed therebetween.

Thus, the front surface portion of the covering layer (stabilizing layer 9 or protective layer 7) of superconducting wire 10 has a concave shape, and therefore, the possibility that another part (another part of superconducting wire 10 for example) overlying the front surface portion contacts the concave region of front surface portion 25 can be reduced. Therefore, the possibility of breakage of superconducting material layer 5 due to the aforementioned contact can be reduced, and accordingly deterioration of the superconducting properties of superconducting wire 10 can be suppressed.

(2) Regarding superconducting wire 10, in a cross section in a width direction of substrate 1, a distance L1 in a thickness direction of the substrate between an apex 21 and a bottom 23 of a region in the concave shape of front surface portion 25 may be not less than 1 µm and not more than 100 µm. In this case, the possibility that another part or the like contacts front surface portion 25 in the concave shape can be reduced, and therefore, the possibility of breakage of superconducting material layer 5 can reliably be reduced. Apex 21 herein refers to a region (region protruding in a convex shape for example) of concave front surface portion 25 located most distant from superconducting material layer 5. Bottom 23 herein refers to a region (deepest region in the inside of the concave shape for example) of front surface portion 25 closest to superconducting material layer 5. If distance L1 is less than 1 µm, the concave shape of front surface portion 25 does not have a sufficient depth, and the above-described effects cannot be produced adequately. If distance L1 is more than 100 µm, the height of the protrusion of apex 21 of front surface portion 25 is excessively large to increase the possibility of breakage or the like of apex 21. The lower limit of distance L1 may be preferably 5 µm, more preferably 10 µm, and still more preferably 15 µm. The upper limit of distance L1 may be preferably 80 µm, more preferably 70 µm, and still more preferably 50 µm.

(3) Regarding superconducting wire 10 (see FIG. 8), in a cross section in a width direction of substrate 1, width W1 of front surface portion 25 may be smaller than width W2 of a region (back surface portion 26) of the superconducting wire located opposite to the front surface portion. In this case, when superconducting wire 10 is wound to form a coil or the like, a gap can be formed between an overlying portion of superconducting wire 10 and another underlying portion of superconducting wire 10 in the multilayer structure of superconducting wire 10. Therefore, the possibility that front surface portion 25 of superconducting wire 10 is damaged by another portion of superconducting wire 10 overlying front surface portion 25 can be reduced.

(4) Regarding superconducting wire 10, a back surface portion 26 of superconducting wire 10 located opposite to front surface portion 25 may have one of a flat shape (see FIG. 1 for example) and a concave shape (see for example FIG. 29). In this case, when superconducting wire 10 forms a multilayer structure, back surface portion 26 can be prevented from directly contacting the central portion of front surface portion 25 (bottom portion of the concave shape for example), since front surface portion 25 is different in shape from back surface portion 26.

(5) Regarding superconducting wire 10 (see FIG. 9), a back surface portion 26 of superconducting wire 10 located opposite to front surface portion 25 may be curved in a convex shape. Front surface portion 25 may be curved in a concave shape. In a cross section in a width direction of substrate 1, back surface portion 26 may be larger in radius of curvature than front surface portion 25. In this case, when superconducting wire 10 forms a multilayer structure, back surface portion 26 can be prevented from directly contacting the central portion of front surface portion 25, since front surface portion 25 is different in radius of curvature from back surface portion 26.

(6) Regarding superconducting wire 10 (see FIG. 12), in a cross section in a width direction of substrate 1, thickness T2 of the covering layer (stabilizing layer 9) on an end of superconducting material layer 5 may be larger than thickness T1 of the covering layer (stabilizing layer 9) on a central portion of superconducting material layer 5. In this case, the apex of the concave shape of front surface portion 25 of the covering layer is the region on the end of superconducting material layer 5. Then, there is a high possibility that the region of the covering layer on the end of superconducting material layer 5 directly contacts another part (another part of superconducting wire 10 overlying the region). Even when another part contacts the region of the covering layer, thickness T2 of the covering layer which is in contact with the other part is sufficiently large, and therefore, the possibility that the pressure due to the contact with the other part exerts an adverse influence on superconducting material layer 5 can be reduced.

(7) A superconducting wire 10 in an aspect of the present invention (see FIG. 16) includes a substrate 1 having a main surface; and a superconducting material layer 5 formed on the main surface. Superconducting material layer 5 has a surface in a concave shape. Thus, when a covering layer such as protective layer 7 or stabilizing layer 9 is to be formed on the surface of superconducting material layer 5, the upper surface (front surface portion 25) of the covering layer can be easily formed in a concave shape. Consequently, the possibility that another part (another part of superconducting wire 10 for example) overlying the upper surface contacts the concave region of front surface portion 25 can be reduced.

(8) Regarding superconducting wire 10 (see FIG. 16), in a cross section in a width direction of substrate 1, a distance L2 in a thickness direction of substrate 1 between an apex 41 (see FIG. 14) and a bottom 43 (see FIG. 14) of a region in the concave shape of the surface of superconducting material layer 5 may be not less than 1 μm and not more than 100 μm. In this case, the value of the internal stress due to the concave shape of the surface of superconducting material layer 5 can be reduced to a level that does not cause an adverse influence on the superconducting properties, and the upper surface of the covering layer formed on the surface of superconducting material layer 5 (see FIG. 16) can reliably be formed in a concave shape. Apex 41 herein refers to a region (region protruding in a convex shape for example) of the concave surface of superconducting material layer 5 most distant from the back surface of substrate 1 (back surface opposite to the surface on which superconducting material layer 5 is formed). Bottom 43 herein refers to a region (deepest region in the inside of the concave shape for example) of the surface of superconducting material layer 5 closest to the back surface of substrate 1. If distance L2 is less than 1 μm, the concave shape of front surface portion 25 of the covering layer (stabilizing layer 9) formed on the surface of superconducting material layer 5 does not have a sufficient depth, and thus the above-described effects cannot be produced adequately. If distance L2 is more than 100 μm, an excessive internal stress may be generated in superconducting material layer 5, resulting in a possibility of deterioration of the superconducting properties. The lower limit of distance L2 may be preferably 5 μm, more preferably 10 μm, and still more preferably 15 μm. The upper limit of distance L2 may be preferably 80 μm, more preferably 70 μm, and still more preferably 50 μm.

(9) A superconducting wire 10 in an aspect of the present invention (see FIG. 20) includes: a substrate 1 having a main surface; and a superconducting material layer 5 formed on the main surface. Main surface 55 of substrate 1 (see FIG. 18) has a concave shape. Thus, when a covering layer such as protective layer 7 or stabilizing layer 9 is formed on superconducting material layer 5 (see FIG. 20), the upper surface (front surface portion 25) of the covering layer can easily be formed in a concave shape. Consequently, the possibility that another part (another part of superconducting wire 10 for example) overlying the upper surface contacts the concave region of front surface portion 25 can be reduced.

(10) Regarding superconducting wire 10 (see FIG. 20), in a cross section in a width direction of substrate 1, a distance L3 in a thickness direction of substrate 1 between an apex 51 and a bottom 53 of a region in the concave shape of main surface 55 of substrate 1 (see FIG. 18) may be not less than 1 μm and not more than 100 μm. In this case, the value of the internal stress generated in superconducting material layer 5 formed on main surface 55 of substrate 1 due to the concave shape of main surface 55 can be reduced to a level that does not cause an adverse influence on the superconducting properties, and the upper surface of the covering layer formed on the surface of superconducting material layer 5 can reliably be formed in a concave shape. Apex 51 herein refers to a region of the surface of substrate 1 in the concave shape (region protruding in a convex shape, or thickest region of the main surface of substrate 1 for example) most distant from the back surface of substrate 1 (back surface opposite to the surface on which superconducting material layer 5 is formed). Bottom 53 refers to a region of the surface of substrate 1 closest to the back surface of substrate 1 (deepest region in the inside of the concave shape, or thinnest portion of main surface 55 of substrate 1, for example). If distance L3 is less than 1 μm, the concave shape of front surface portion 25 of the covering layer (stabilizing layer 9) formed on the surface of multilayer stack 20 which includes main surface 55 of substrate 1 and superconducting material layer 5 does not have a sufficient depth, and thus the above-described effects cannot be produced adequately. If distance L3 is larger than 100 μm, an excessive internal stress may be generated in superconducting material layer 5 formed on main surface 55 of substrate 1, resulting in a possibility of deterioration of the superconducting properties. The lower limit of distance L3 may be preferably 5 μm, more preferably 10 μm, and still more preferably 15 μm. The upper limit of distance L3 may be preferably 80 μm, more preferably 70 μm, and still more preferably 50 μm.

(11) Regarding superconducting wire 10 (see FIG. 23), in a cross section in a width direction of substrate 1, width W3 of main surface 55 (FIG. 21) may be smaller than width W4 of a region (back surface 56 in FIG. 21) of substrate 1 located opposite to main surface 55. In this case, when superconducting wire 10 is wound to form a coil or the like, a gap can be formed between an overlying portion of superconducting wire 10 and another underlying portion of superconducting wire 10 in the multilayer structure of superconducting wire 10. Therefore, the possibility that the surface (front surface portion 25) of superconducting wire 10 on the side where superconducting material layer 5 is formed is damaged by another overlying portion of superconducting wire 10 can be reduced.

Figure 27:
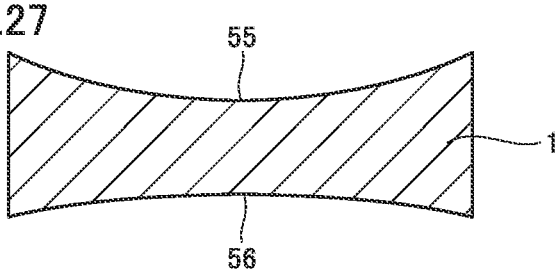
FIG. 27 is a schematic cross-sectional view for illustrating a method of manufacturing a superconducting wire in a ninth embodiment of the present invention.

(12) Regarding superconducting wire 10 (see FIG. 20 or 29), a back surface 56 of substrate 1 located opposite to main surface 55 (see FIG. 18 or 27) may have one of a flat shape (see FIG. 18) and a concave shape (see FIG. 27). In this case, when superconducting wire 10 forms a multilayer structure, back surface portion 26 can be prevented from directly contacting the central portion of front surface portion 25 in the concave shape conforming to the shape of main surface 55 (contacting the bottom portion of the concave shape for example), since the surface on the main surface 55 side of substrate 1 (front surface portion 25 in FIG. 20 or 29) is different in shape from the surface on the back surface 56 side of substrate 1 (back surface portion 26 in FIG. 20 or 29).

(13) Regarding superconducting wire 10 (see FIG. 26), a back surface 56 (see FIG. 24) of substrate 1 located opposite to main surface 55 (see FIG. 24) may be curved in a convex shape, and main surface 55 may be curved in a concave shape. In a cross section in a width direction of substrate 1, back surface 56 may be larger in radius of curvature than main surface 55. In this case, when superconducting wire 10 (see FIG. 26) forms a multilayer structure, back surface portion 26 can be prevented from directly contacting a central portion of front surface portion 25, since the radius of curvature of the surface (front surface portion 25) of superconducting wire 10 located on the main surface 55 side of substrate 1 can easily be made different from the radius of curvature of the back surface (back surface portion 26) of superconducting wire 10 located on the back surface 56 side of substrate 1.

Details of Embodiments of the Invention

Embodiments of the present invention will be described hereinafter based on the drawings. In the following drawings, the same or corresponding parts are denoted by the same reference numerals, and a description thereof will not be repeated.

First Embodiment

Configuration of Superconducting Wire

FIG. 1 is a schematic cross-sectional view showing a configuration of a superconducting wire in a first embodiment of the present invention. FIG. 1 shows a cross section in the direction crossing the direction in which a superconducting wire 10 in the first embodiment extends. Therefore, the direction crossing the plane of the drawing is the longitudinal direction of the superconducting wire, and superconducting current in a superconducting material layer 5 is to flow in the direction crossing the plane of the drawing. Moreover, in the schematic cross-sectional views in FIG. 1 and subsequent drawings, the difference between the dimension in the top-bottom direction (hereinafter also referred to as "thickness direction") and the dimension in the left-right direction (hereinafter also referred to as "width direction") of the rectangular cross section is shown to be small for the sake of easy recognition of the drawings. However, actually the dimension in the thickness direction of the cross section is sufficiently smaller than the dimension in the width direction of the cross section.

Referring to FIG. 1, superconducting wire 10 in the first embodiment has a lengthy shape (tape shape) with a rectangular cross section, and the relatively larger surfaces of the wire extending in the longitudinal direction of the lengthy shape are herein defined as main surfaces. Superconducting wire 10 includes a substrate 1, an intermediate layer 3, a superconducting material layer 5, a protective layer 7, and a stabilizing layer 9.

Substrate 1 has a first main surface and a second main surface. The second main surface is located opposite to the first main surface. Preferably, substrate 1 is made of a metal for example and has a lengthy shape (tape shape) with a rectangular cross section. For the superconducting wire to be wound in a coil shape, preferably substrate 1 extends for a long distance of approximately 2 km, for example.

More preferably, an orientation-aligned metal substrate is used as substrate 1. The orientation-aligned metal substrate means a substrate in which crystal orientations are aligned in two axis directions in a plane of the substrate surface. For the orientation-aligned metal substrate, preferably an alloy of at least two metals selected from nickel (Ni), copper (Cu), chromium (Cr), manganese (Mn), cobalt (Co), iron (Fe), palladium (Pd), silver (Ag), and gold (Au), for example, is used. These metals and another metal or alloy may be stacked together. For example, an alloy such as SUS which is a high-strength material may also be used. The material for substrate 1 is not limited to the aforementioned ones, and any material other than the metal for example may be used.

Superconducting wire 10 has a dimension in the width direction of approximately 4 mm to 10 mm, for example. In order to increase the density of current flowing in superconducting wire 10, a smaller cross-sectional area of substrate 1 is preferred. However, an excessively thin thickness (in the top-bottom direction in FIG. 1) of substrate 1 may result in deterioration of the strength of substrate 1. Therefore, the thickness of substrate 1 is preferably about 0.1 mm.

Intermediate layer 3 is formed on the first main surface of substrate 1. Superconducting material layer 5 is formed on the main surface (upper main surface in FIG. 1) of intermediate layer 3 opposite to the main surface thereof facing substrate 1. Namely, superconducting material layer 5 is disposed on the first main surface of substrate 1 with intermediate layer 3 between superconducting material layer 5 and substrate 1. The material forming intermediate layer 3 is preferably yttria-stabilized zirconia (YSZ), cerium oxide ($CeO_2$), magnesium oxide (MgO), yttrium oxide ($Y_2O_3$), and strontium titanate ($SrTiO_3$), for example. These materials have an extremely low reactivity with superconducting material layer 5 and do not deteriorate the superconducting properties of superconducting material layer 5 even at the boundary abutting on superconducting material layer 5. Particularly in the case where a metal is used as a material forming substrate 1, the intermediate layer can perform a function of alleviating difference in orientation alignment between superconducting material layer 5 and substrate 1 having crystal orientation alignment in its surface to thereby prevent metal atoms from escaping from substrate 1 into superconducting material layer 5 during formation of superconducting material layer 5 at a high temperature. The material forming intermediate layer 3 is not particularly limited to the aforementioned ones.

Intermediate layer 3 may be made up of a plurality of layers. In the case where intermediate layer 3 is made up of a plurality of layers, the layers constituting intermediate layer 3 may be formed of respective materials different from each other, or some of the layers constituting intermediate layer 3 may be made of the same material. Superconducting material layer 5 is a thin-film layer in superconducting wire 10, and superconducting current flows in this superconducting material layer 5. While the superconducting material is not particularly limited, the superconducting material is preferably an RE-123-based oxide superconductor, for example. RE-123-based oxide superconductor means a superconductor represented by $REBa_2Cu_3O_y$ (y is 6 to 8, more preferably 6.8 to 7, and RE represents yttrium or rare-earth element such as Gd, Sm, Ho, or the like). In order to improve the magnitude of the superconducting current flowing in superconducting material layer 5, superconducting material layer 5 preferably has a thickness of 0.5 μm to 10 μm.

Protective layer 7 is formed on the main surface (upper main surface in FIG. 1) of superconducting material layer 5 opposite to the main surface thereof facing intermediate layer 3. Preferably, protective layer 7 is made for example of silver (Ag) or silver alloy, and has a thickness of not less than 0.1 μm and not more than 50 μm.

Above-described substrate 1, intermediate layer 3, superconducting material layer 5, and protective layer 7 constitute a multilayer stack 20. Stabilizing layer 9 is disposed to cover the periphery of multilayer stack 20. In the present embodiment, stabilizing layer 9 is disposed to cover the outer periphery of multilayer stack 20, namely cover substantially the whole outermost surface of multilayer stack 20. It should be noted that "periphery of the multilayer stack" of the present invention is not limited to the whole periphery and may be only a main surface of the multilayer stack.

Stabilizing layer 9 is formed of a highly conductive metal foil or plating layer, or the like. Stabilizing layer 9 functions as a bypass together with protective layer 7 for commutation of the current in superconducting material layer 5 when transition of superconducting material layer 5 from the superconducting state to the normal conducting state occurs. The material forming stabilizing layer 9 is preferably copper (Cu), or copper alloy or the like, for example. While the thickness of stabilizing layer 9 is not particularly limited, the thickness is preferably 10 μm to 500 μm for physically protecting protective layer 7 and superconducting material layer 5.

As shown in FIG. 1, the two opposite ends of multilayer stack 20 which are opposite ends in the direction (width direction) perpendicular to the direction in which multilayer stack 20 extends protrude in the direction toward the front surface of protective layer 7. Namely, the front surface of protective layer 7 in multilayer stack 20 has a concave shape in the cross section in the aforementioned direction (width direction) perpendicular to the direction in which multilayer stack 20 extends. The back surface of substrate 1 in multilayer stack 20 (the second main surface of substrate 1 located opposite to the first main surface thereof on which intermediate layer 3 is formed) has a flat shape.

A front surface portion 25 of stabilizing layer 9 which is formed to cover the outer periphery of multilayer stack 20 also has a concave shape in the cross section perpendicular to the direction in which multilayer stack 20 extends. Front surface portion 25 is a surface on the side where superconducting material layer 5 is formed. A back surface portion 26 of stabilizing layer 9 has a flat shape. Back surface portion 26 is the surface of a portion of stabilizing layer 9 located on the back surface of substrate 1. Distance L1 in the thickness direction of substrate 1 between a bottom 23 and an apex 21 of front surface portion 25 may for example be not less than 1 μm and not more than 100 μm. Bottom 23 is substantially at the center of front surface portion 25 in the width direction. Apex 21 is located an end of front surface portion 25 in the width direction.

Thus, front surface portion 25 of stabilizing layer 9 which is located at the side where superconducting material layer 5 is formed has a concave shape. Therefore, in such a case where superconducting wire 10 is wound in a coil shape, it is possible to suppress occurrence of a problem such as damage to superconducting material layer 5 resulting from contact between front surface portion 25 and another component or another part of wound superconducting wire 10.

Method of Manufacturing Superconducting Wire

Referring to FIGS. 2 to 7, a method of manufacturing superconducting wire 10 shown in FIG. 1 will be described. In the following, the present embodiment will be specifically described in connection with a method of manufacturing superconducting wire 10 using a multilayer stack 20 which is fabricated to have a width of 30 mm and subjected to wire thinning to thereby have a width of 4 mm, by way of example.

Figure 2:
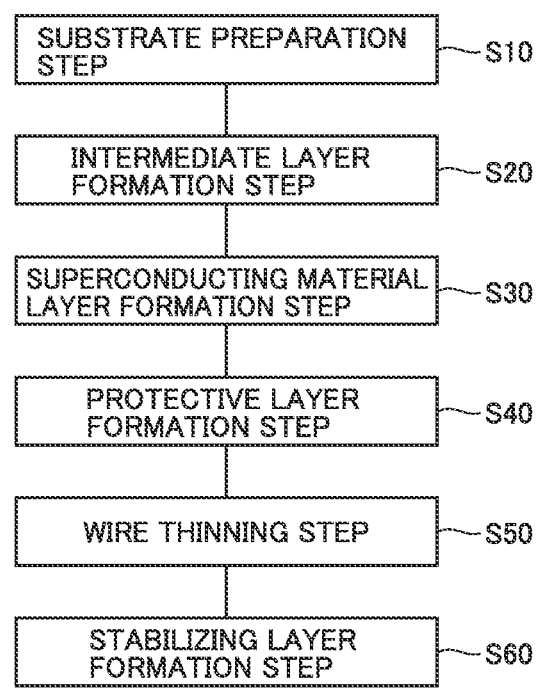
FIG. 2 is a flowchart showing a method of manufacturing a superconducting wire in the first embodiment.
Figure 3:
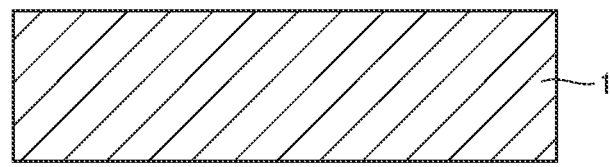
FIG. 3 is a schematic cross-sectional view for illustrating the method of manufacturing a superconducting wire in the first embodiment.
Figure 4:
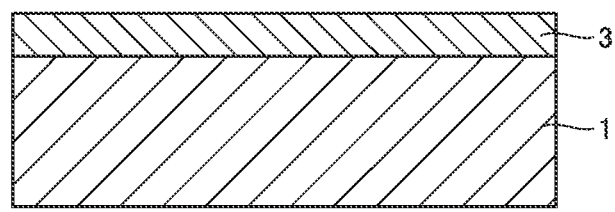
FIG. 4 is a schematic cross-sectional view for illustrating the method of manufacturing a superconducting wire in the first embodiment.
Figure 5:
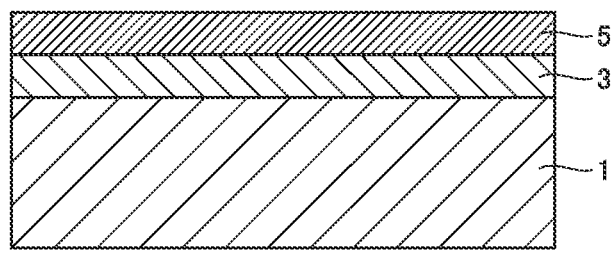
FIG. 5 is a schematic cross-sectional view for illustrating the method of manufacturing a superconducting wire in the first embodiment.
Figure 6:
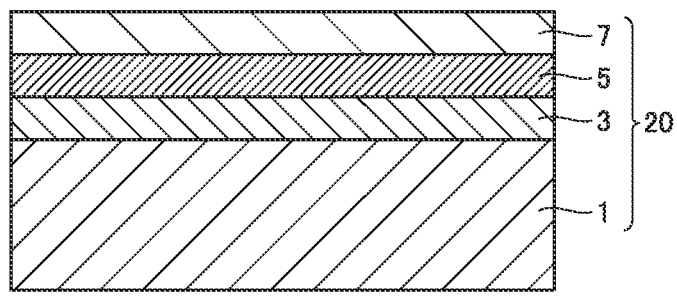
FIG. 6 is a schematic cross-sectional view for illustrating the method of manufacturing a superconducting wire in the first embodiment.

FIG. 2 is a flowchart showing a method of manufacturing a superconducting wire in the first embodiment. Referring to FIG. 2, initially a substrate preparation step (S10) is performed. Specifically, referring to FIG. 3, a substrate 1 formed of an orientation-aligned metal substrate and having a tape shape with a width of 30 mm is prepared. Substrate 1 has a first main surface and a second main surface located opposite to the first main surface. The thickness of substrate 1 may be adjusted appropriately to meet any purpose, and can be usually in a range of 10 μm to 500 μm. For example, the thickness of substrate 1 is approximately 100 μm.

Next, an intermediate layer formation step (S20 in FIG. 2) of forming an intermediate layer 3 on substrate 1 is performed. Specifically, referring to FIG. 4, intermediate layer 3 is formed on the first main surface of substrate 1. As the method of forming intermediate layer 3, any method may be used. For example, a physical vapor deposition method such as pulsed laser deposition (PLD) method may be used.

Next, a superconducting material layer formation step (S30 in FIG. 2) of forming a superconducting material layer 5 on intermediate layer 3 is performed. Specifically, referring to FIG. 5, superconducting material layer 5 made of an RE-123-based oxide superconductor is formed on the main surface (upper main surface in FIG. 5) of intermediate layer 3 opposite to the main surface thereof facing substrate 1. As the method of forming superconducting material layer 5, any method may be used. For example, a vapor phase method, a liquid phase method, or a combination of them may be used to form the layer. Examples of the vapor phase method are laser vapor deposition method, sputtering method, electron beam vapor deposition method, and the like. This step can be performed by at least one of laser vapor deposition method, sputtering method, electron beam method, and organic metal deposition method to form superconducting material layer 5 having its surface excellent in crystal orientation alignment and surface smoothness.

Next, a protective layer formation step (S40 in FIG. 2) of forming a protective layer 7 on superconducting material layer 5 is performed. Specifically, referring to FIG. 6, protective layer 7 made of silver (Ag) or silver alloy is formed on the main surface (upper main surface in FIG. 6) of superconducting material layer 5 opposite to the main surface thereof facing intermediate layer 3, by a physical vapor deposition method such as sputtering, electroplating method, or the like, for example. Protective layer 7 can be formed to protect the surface of superconducting material layer 5. After this, oxygen annealing, namely heating in an oxygen ambient (oxygen introduction step) is performed to introduce oxygen into superconducting material layer 5. Through the above-described steps, a multilayer stack 20 having a dimension in the width direction of approximately 30 mm is formed.

Figure 7:
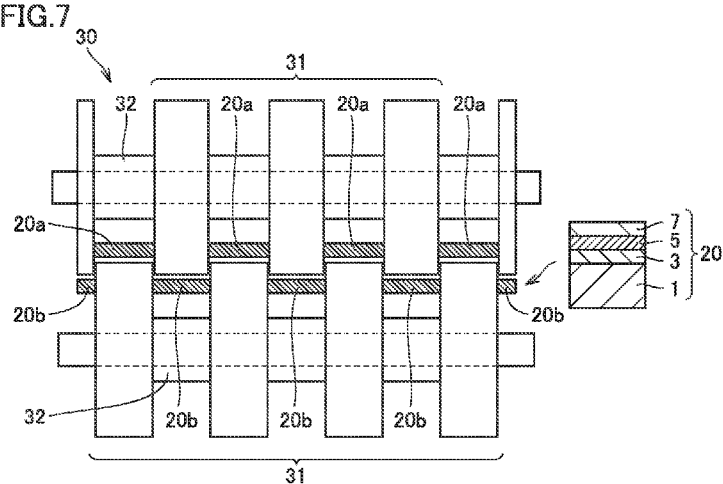
FIG. 7 is a diagram schematically showing a configuration of a slitter used for a wire thinning step.

Next, a wire thinning step (S50 in FIG. 3) of cutting multilayer stack 20 of 30 mm in width into those each having a predetermined width (4 mm for example) is performed. Specifically, as shown in FIG. 7, mechanical slitting, namely mechanical cutting of multilayer stack 20 of 30 mm in width with rotary blades, is performed to produce, from multilayer stack 20, thinned wires each having a width of 4 mm. FIG. 7 schematically shows a configuration of a slitter 30 used for the wire thinning step. At the right side in FIG. 7, the configuration of multilayer stack 20 undergoing slitting by slitter 30 is shown. In multilayer stack 20, intermediate layer 3, superconducting material layer 5, and protective layer 7 are superposed in this order on substrate 1.

Referring to FIG. 7, slitter 30 includes a plurality of rotary blades 31 and a plurality of spacers 32. In the present embodiment, slitter 30 includes seven rotary blades 31 in total, for example. On an upper rotational shaft of slitter 30, three rotary blades 31 each having a width of about 4 mm are arranged. Between rotary blades 31 adjacent to each other in the direction of the rotational axis, spacer 32 is disposed. On a lower rotational shaft of slitter 30 as well, four rotary blades 31 each having a width of about 4 mm are arranged. The width of rotary blades 31 arranged on the upper rotational shaft and the lower rotational shaft can be set to any width.

As shown in FIG. 7, a multilayer stack 20b produced by slitting with rotary blade 31 contacting from the protective layer 7 side has a cross-sectional shape as shown in FIG. 1 which has protruding ends, in the width direction, of superconducting material layer 5 and protective layer 7 (the surface of protective layer 7 has a concave shape). This cross-sectional shape is obtained by adjusting conditions for slitting such as the distance between adjacent rotary blades 31 or the height of overlapping thereof. Accordingly, multilayer stack 20b (thin wire having a width of 4 mm) having the cross-sectional shape as shown in FIG. 1 can be obtained.

As described above, the mechanical slitting is cutting through shearing by means of upper rotary blade 31 and opposite lower rotary blade 31. For each of obtained thin wires (multilayer stacks 20a, 20b), edges are curved depending on the direction in which rotary blade 31 is applied (direction of slitting). Specifically, regarding a thin wire (multilayer stack 20b) produced by slitting from the protective layer 7 side with upper rotary blade 31, substrate 1 is curved at the edges toward protective layer 7. In contrast, regarding a thin wire (multilayer stack 20a) produced by slitting from the substrate 1 side with lower rotary blade 31, protective layer 7 and the ceramic layer are curved at the edges toward substrate 1.

For the mechanical slitting shown in FIG. 7, the width of rotary blade 31 applied from the substrate 1 side is equal to the width of rotary blade 31 applied from the protective layer 7 side. However, as rotary blade 31 applied from the protective layer 7 side, rotary blade 31 having a predetermined wire width (4 mm for example) may be used and, as rotary blade 31 applied from the substrate 1 side, a narrower rotary blade 31 may be used. In this way, the number of thin wires produced by slitting from the protective layer 7 side (the number of multilayer stacks 20 having the upper surface of protective layer 7 in a concave shape as shown in FIG. 1) can be increased.

Referring again to FIG. 2, finally, a stabilizing layer formation step (S60 in FIG. 2) of forming a stabilizing layer 9 on the periphery of multilayer stack 20 having undergone the wire thinning is performed. Specifically, stabilizing layer 9 made of copper (Cu) or copper alloy is formed through the known plating to cover the outer periphery of multilayer stack 20, namely to cover substantially the whole outermost surface of multilayer stack 20. The method of forming stabilizing layer 9 may be bonding of copper foil other than the plating. Through the above-described steps, superconducting wire 10 in the first embodiment shown in FIG. 1 is manufactured.

Second Embodiment

Figure 8:
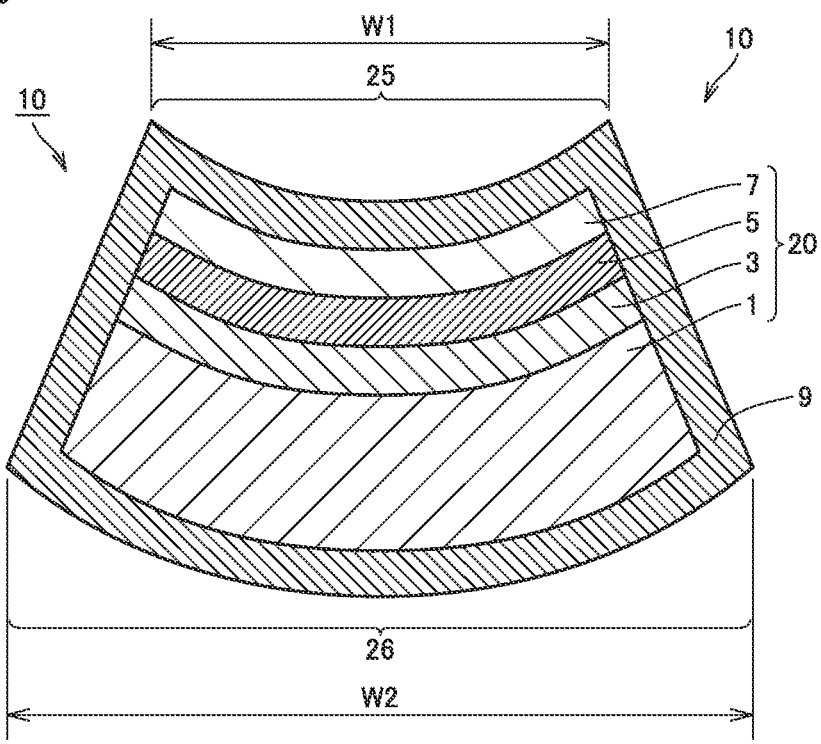
FIG. 8 is a schematic cross-sectional view showing a configuration of a superconducting wire in a second embodiment of the present invention.

Referring to FIG. 8, a second embodiment of the superconducting wire of the present invention will be described.

Referring to FIG. 8, a superconducting wire 10 has a configuration which is basically similar to that of the superconducting wire shown in FIG. 1. However, superconducting wire 10 in FIG. 8 differs from superconducting wire 10 shown in FIG. 1 in that the back surface of substrate 1 which is an element of multilayer stack 20 (back surface of the substrate located opposite to the upper surface thereof on which intermediate layer 3 is formed) is curved in the shape of an outward convex, and in that a back surface portion 26 of stabilizing layer 9 (surface of stabilizing layer 9 located opposite to the side where superconducting material layer 5 is formed, with respect to substrate 1) is curved in the shape of an outward convex. Further, regarding superconducting wire 10 shown in FIG. 8, width W2 of back surface portion 26 of stabilizing layer 9 is larger than width W1 of front surface portion 25 thereof. Further, the two opposite end surfaces of stabilizing layer 9 (two side surfaces connecting front surface portion 25 and back surface portion 26) are inclined toward each other. The two opposite end surfaces of multilayer stack 20 (two side surfaces where substrate 1, intermediate layer 3, superconducting material layer 5, and protective layer 7 are exposed) are also inclined in the direction in which they cross each other.

From superconducting wire 10 having such a configuration, similar effects to those of superconducting wire 10 shown in FIG. 1 can be obtained as well. Further, in such a case where superconducting wire 10 shown in FIG. 8 is wound in a coil shape, the difference in width between front surface portion 25 and back surface portion 26 enables a gap to be formed between an inner portion of wound superconducting wire 10 and an outer portion thereof overlying the inner portion. Therefore, as compared with the case where a portion of superconducting wire 10 is in close contact with another portion thereof overlying the former portion, the probability that a scratch or the like is made on front surface portion 25 of superconducting wire 10 can be reduced.

Figure 9:
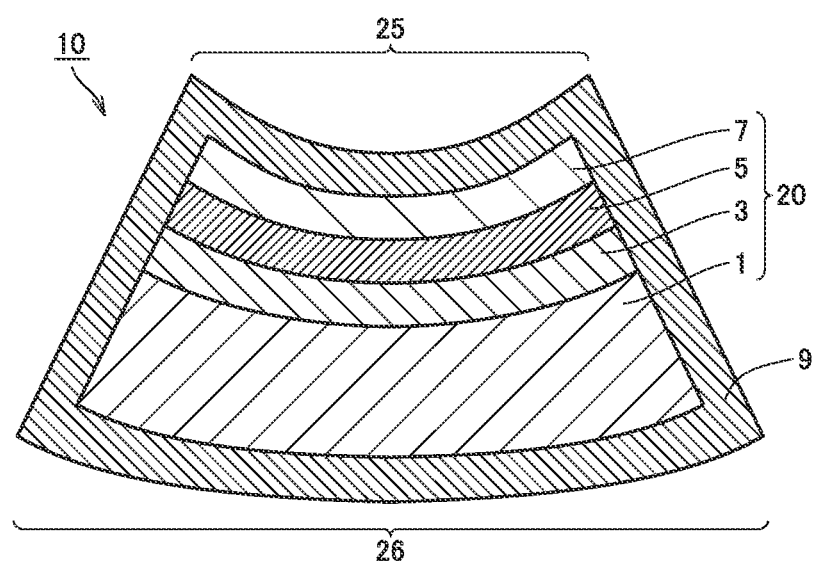
FIG. 9 is a schematic cross-sectional view showing a modification of the superconducting wire shown in FIG. 8.

Referring to FIG. 9, a modification of the second embodiment of superconducting wire 10 of the present invention will be described. While superconducting wire 10 shown in FIG. 9 has a configuration which is basically similar to that of superconducting wire 10 shown in FIG. 8, the radius of curvature of front surface portion 25 is different from the radius of curvature of back surface portion 26. Specifically, regarding superconducting wire 10 shown in FIG. 9, the radius of curvature of back surface portion 26 is larger than the radius of curvature of front surface portion 25. Thus, in the case where superconducting wire 10 is wound to form a multilayer structure, front surface portion 25 of underlying superconducting wire 10 can be prevented from being in close contact with back surface portion 26 of overlying superconducting wire 10. Therefore, front surface portion 25 can be prevented from being scratched for example by another portion of superconducting wire 10 overlying the aforementioned front surface portion 25.

Third Embodiment

Figure 10:
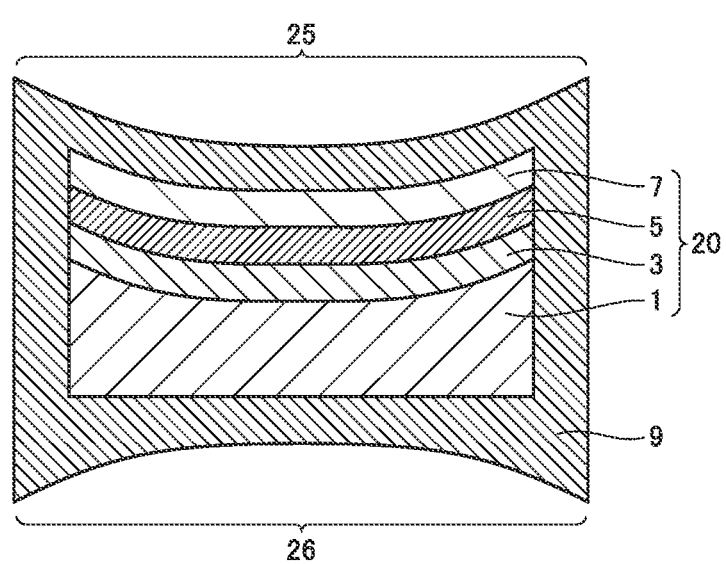
FIG. 10 is a schematic cross-sectional view showing a configuration of a superconducting wire in a third embodiment of the present invention.

Referring to FIG. 10, a third embodiment of the superconducting wire of the present invention will be described.

Referring to FIG. 10, while superconducting wire 10 has a configuration which is basically similar to that of the superconducting wire shown in FIG. 1, back surface portion 26 of stabilizing layer 9 is a concave (curved) portion depressed toward substrate 1. From superconducting wire 10 having such a configuration, similar effects to those of superconducting wire 10 shown in FIG. 1 can be obtained as well. Moreover, when superconducting wire 10 is wound to form a multilayer structure, the area of a contact region where front surface portion 25 of wound multilayer superconducting wire 10 contacts another portion (back surface portion 26) of superconducting wire 10 overlying the aforementioned front surface portion 25 can be reduced. Therefore, the probability that a scratch or the like is made on front surface portion 25 can be reduced. Consequently, occurrence of such a problem that a defect is generated in superconducting material layer 5 due to the scratch, leading to deterioration of the superconducting properties can be suppressed.

While any method may be used as the method of manufacturing stabilizing layer 9 of superconducting wire 10 shown in FIG. 10, the following method may be used. Namely, the field intensity for plating of the ends of multilayer stack 20 in the width direction for example may be made higher than the field intensity for other portions, to thereby make the thickness of the ends of stabilizing layer 9 relatively larger.

Figure 11:
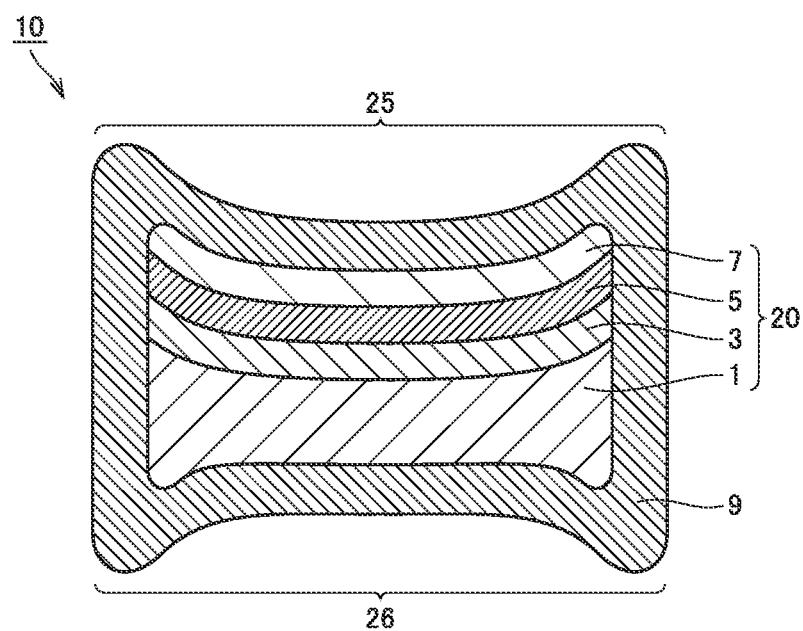
FIG. 11 is a schematic cross-sectional view showing a modification of the superconducting wire shown in FIG. 10.

Referring to FIG. 11, a modification of the superconducting wire shown in FIG. 10 will be described. While superconducting wire 10 shown in FIG. 11 has a configuration basically similar to that of the superconducting wire shown in FIG. 10, the shape of the back surface of substrate 1 which is an element of multilayer stack 20 (surface of substrate 1 located opposite to the surface thereof on which intermediate layer 3 is formed) differs from that of substrate 1 of superconducting wire 10 shown in FIG. 10. Specifically, the back surface of substrate 1 of superconducting wire 10 shown in FIG. 11 is curved in the shape of a concave toward superconducting material layer 5. The shape of back surface portion 26 of stabilizing layer 9 is also a concave shape curved to conform to the shape of the back surface of substrate 1. Moreover, while the corners of the cross section of substrate 1 in superconducting wire 10 shown in FIG. 10 are each a corner formed by two lines meeting at an acute angle or a substantially right angle, the corners of the cross section of substrate 1 in superconducting wire 10 shown in FIG. 11 are curved corners. Therefore, the four corners of the outer periphery of stabilizing layer 9 in the cross section in the width direction of superconducting wire 10 are also curved to conform to the corners of substrate 1.

From superconducting wire 10 having such a configuration, similar effects to those of superconducting wire 10 shown in FIG. 10 can be obtained as well.

Multilayer stack 20 which is an element of superconducting wire 10 shown in FIG. 11 can be obtained for example by laser slitting of wide multilayer stack 20. Moreover, stabilizing layer 9 shown in FIG. 11 can be formed by any conventionally known method such as plating to cover the surface of multilayer stack 20.

Fourth Embodiment

Figure 12:
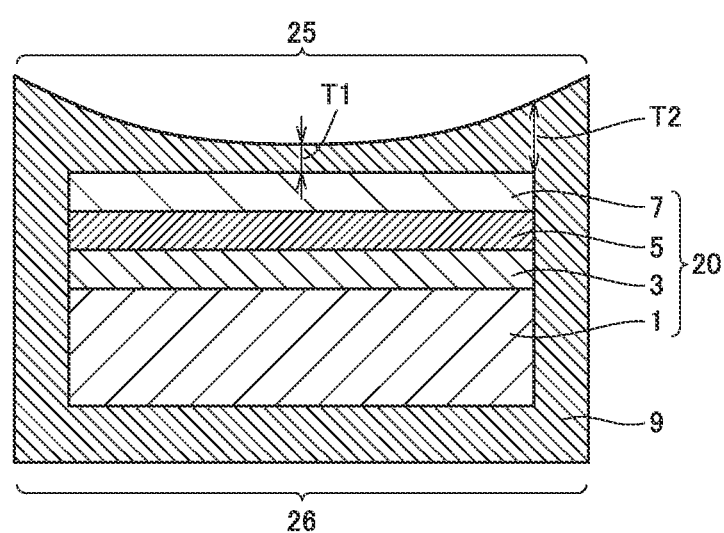
FIG. 12 is a schematic cross-sectional view showing a configuration of a superconducting wire in a fourth embodiment of the present invention.

Referring to FIG. 12, a fourth embodiment of the superconducting wire of the present invention will be described. Referring to FIG. 12, while superconducting wire 10 has a configuration which is basically similar to that of superconducting wire 10 shown in FIG. 1, the shape of multilayer stack 20 differs from the shape of multilayer stack 20 of superconducting wire 10 shown in FIG. 1. Specifically, in superconducting wire 10 shown in FIG. 12, respective upper surfaces of substrate 1, intermediate layer 3, superconducting material layer 5, and protective layer 7 each have a substantially flat shape. Thus, thickness T2 of stabilizing layer 9 on the ends of the surface of protective layer 7 is larger than thickness T1 of stabilizing layer 9 on the center of the surface of protective layer 7. Therefore, even when a stress is exerted on the ends of stabilizing layer 9 in FIG. 12 (ends of the upper surface of stabilizing layer 9 in a concave shape), thickness T2 of stabilizing layer 9 is sufficiently large to enable reduction of the influence of the stress on protective layer 7 and superconducting material layer 5. Accordingly, the risk of breakage of superconducting material layer 5 due to the externally applied stress can be reduced.

Multilayer stack 20 of superconducting wire 10 shown in FIG. 12 can be obtained for example by the following method. Namely, substrate 1 having a rectangular cross section forming the width of multilayer stack 20 is prepared and intermediate layer 3, superconducting material layer 5, and protective layer 7 are successively formed on the main surface of substrate 1. Stabilizing layer 9 shown in FIG. 12 can be formed for example by a similar method to that for stabilizing layer 9 of superconducting wire 10 shown in FIG. 10.

Fifth Embodiment

Figure 13:
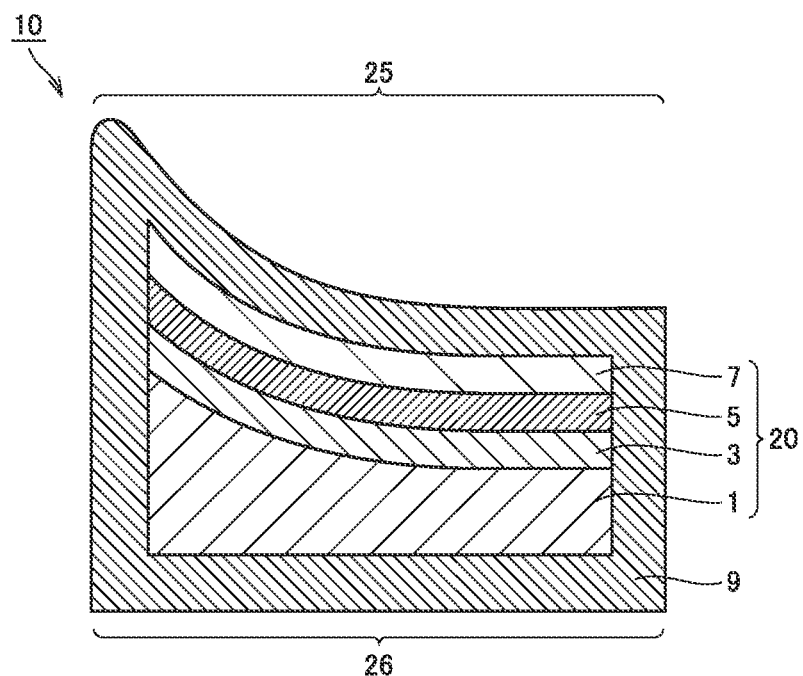
FIG. 13 is a schematic cross-sectional view showing a configuration of a superconducting wire in a fifth embodiment of the present invention.

FIG. 13 is a schematic cross-sectional view showing a fifth embodiment of superconducting wire 10 of the present invention. Referring to FIG. 13, the fifth embodiment of the superconducting wire of the present invention will be described.

Referring to FIG. 13, while superconducting wire 10 has a configuration which is basically similar to that of superconducting wire 10 shown in FIG. 1, respective shapes of multilayer stack 20 and front surface portion 25 of stabilizing layer 9 differ from those of superconducting wire 10 shown in FIG. 1. Specifically, regarding superconducting wire 10 shown in FIG. 13, only one end of the upper surface of each of substrate 1, intermediate layer 3, superconducting material layer 5, and protective layer 7 constituting multilayer stack 20 protrudes relative to the other end thereof. Thus, one end of front surface portion 25 of stabilizing layer 9 corresponding to the protruding end of multilayer stack 20 is also protruding and has a concave and curved shape. Such a shape of front surface portion 25, namely a concave and curved shape resulting from the fact that the one end is protruding is also referred to herein as a concave shape. Like superconducting wire 10 shown in FIG. 1, superconducting wire 10 shown in FIG. 13 also enables suppression of scratch on front surface portion 25 due to contact with another component or the like.

Multilayer stack 20 of superconducting wire 10 shown in FIG. 13 may for example be an end portion of a wide multilayer stack 20 (base material) which is to be thinned by slitter 30 shown in FIG. 7 (namely the portion cut away along only one end with rotary blade 31). Moreover, stabilizing layer 9 shown in FIG. 13 can be formed by any conventionally known method such as plating to surround the periphery of multilayer stack 20.

Sixth Embodiment

Figure 14:
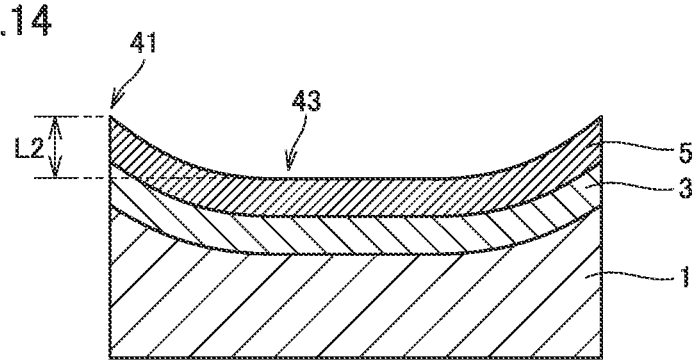
FIG. 14 is a schematic cross-sectional view for illustrating a method of manufacturing a superconducting wire in a sixth embodiment of the present invention.

FIG. 14 is a schematic diagram showing a stage during a process of manufacturing a superconducting wire in a sixth embodiment of the present invention. Referring to FIG. 14, according to a method of manufacturing a superconducting wire in the sixth embodiment of the present invention, intermediate layer 3 and superconducting material layer 5 are formed on the upper surface of substrate 1. At this time, the surface of superconducting material layer 5 is curved in the shape of a concave toward substrate 1. The configuration as shown in FIG. 14 can be obtained by any conventionally known method. For example, substrate 1 having a cross-sectional shape as shown in FIG. 14 may be prepared as substrate 1, and intermediate layer 3 and superconducting material layer 5 may be formed on the main surface (main surface depressed in a concave shape) of substrate 1. Alternatively, intermediate layer 3 and superconducting material layer 5 may be formed on the main surface of substrate 1 having a rectangular cross-sectional shape, and thereafter the resultant structure may be thinned with a slitter shown in FIG. 7 or the like to obtain the configuration (multilayer stack made up of substrate 1, intermediate layer 3, and superconducting material layer 5) having the cross-sectional shape as shown in FIG. 14.

Figure 15:
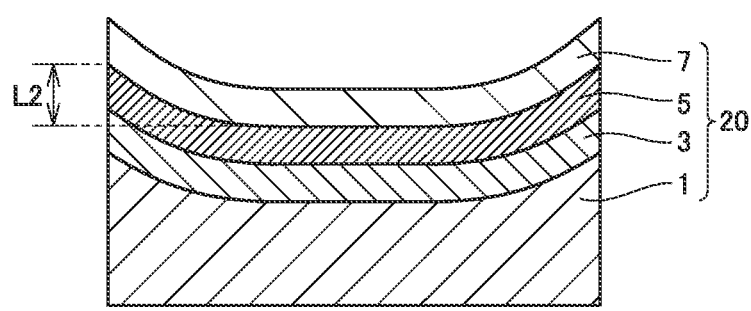
FIG. 15 is a schematic cross-sectional view for illustrating the method of manufacturing a superconducting wire in the sixth embodiment of the present invention.
Figure 16:
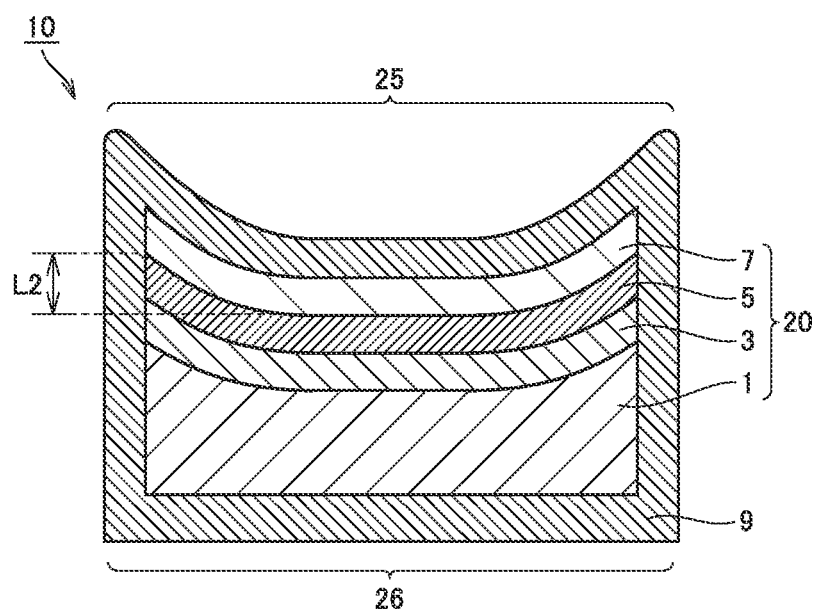
FIG. 16 is a schematic cross-sectional view for illustrating a superconducting wire in the sixth embodiment of the present invention.

At this time, distance L2 in the thickness direction of substrate 1 between a bottom 43 located at a central portion in the width direction of superconducting material layer 5 and an apex 41 located at an end in the width direction of superconducting material layer 5 may for example be not less than 1 µm and not more than 100 µm. As shown in FIG. 15, protective layer 7 can be formed on superconducting material layer 5 to obtain multilayer stack 20 shown in FIG. 15. Intermediate layer 3, superconducting material layer 5, and protective layer 7 may be formed on the main surface of substrate 1 having a rectangular cross section, and thereafter a slitter as shown in FIG. 7 may be used to perform a wire thinning step (S50) (see FIG. 2) to thereby obtain the configuration as shown in FIG. 15. When such a multilayer stack 20 is obtained and stabilizing layer 9 is to be formed around the multilayer stack as shown in FIG. 16, it is easy to form front surface portion 25 of stabilizing layer 9 into a concave and curved shape (concave portion) as shown in FIG. 16. From superconducting wire 10 having the configuration as shown in FIG. 16, similar effects to those of superconducting wire 10 shown in FIG. 1 can be obtained as well.

Figure 17:
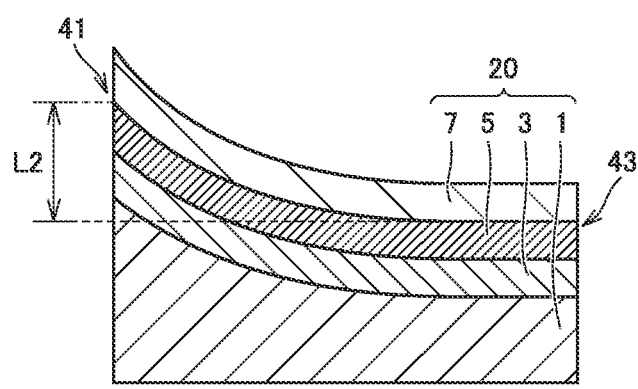
FIG. 17 is a schematic cross-sectional view for illustrating a method of manufacturing a modification of the superconducting wire in the sixth embodiment of the present invention.

In the above-described wire thinning step (S50), the end portion of multilayer stack 20 obtained by thinning thereof may be deformed so that the one end along which multilayer stack 20 is cut with rotary blade 31 of the slitter protrudes to form the shape as shown in FIG. 17, as described above in connection with the method of manufacturing superconducting wire 10 shown in FIG. 13. Specifically, regarding the shape as shown in FIG. 17, only one end, in the width direction, of superconducting material layer 5 (and protective layer 7) protrudes and superconducting material layer 5 and protective layer 7 have a concave and curved surface. In this case as well, distance L2 between apex 41 of superconducting material layer 5 (protruding end of superconducting material layer 5) and bottom 43 (end opposite to the protruding end of superconducting material layer 5) may be not less than 1 µm and not more than 100 µm. Multilayer stack 20 having such a configuration can be used to form stabilizing layer 9 surrounding the outer periphery of multilayer stack 20, and thereby form the superconducting wire as shown in FIG. 13. In this case as well, similar effects to those of the superconducting wire shown in FIG. 1 can be obtained.

Seventh Embodiment

Figure 18:
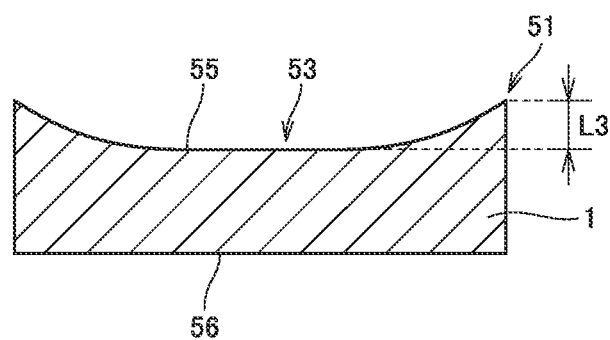
FIG. 18 is a schematic cross-sectional view for illustrating a method of manufacturing a superconducting wire in a seventh embodiment of the present invention.

FIG. 18 is a schematic cross-sectional view showing substrate 1 for forming a superconducting wire in a seventh embodiment of the present invention. Substrate 1 shown in FIG. 18 has an upper surface (main surface) in the shape of a depressed concave curve (concave portion). The back surface of substrate 1 (back surface opposite to the upper surface) has a flat shape. Distance L3 between an apex 51 of the upper surface and a bottom 53 thereof (distance in the thickness direction of substrate 1) may be not less than 1 µm and not more than 100 µm.

Figure 19:
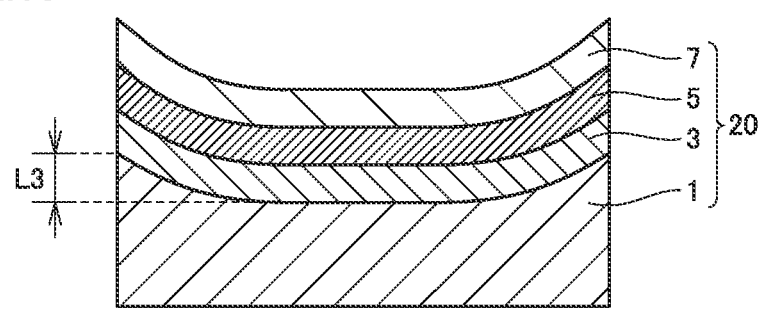
FIG. 19 is a schematic cross-sectional view for illustrating the method of manufacturing a superconducting wire in the seventh embodiment of the present invention.
Figure 20:
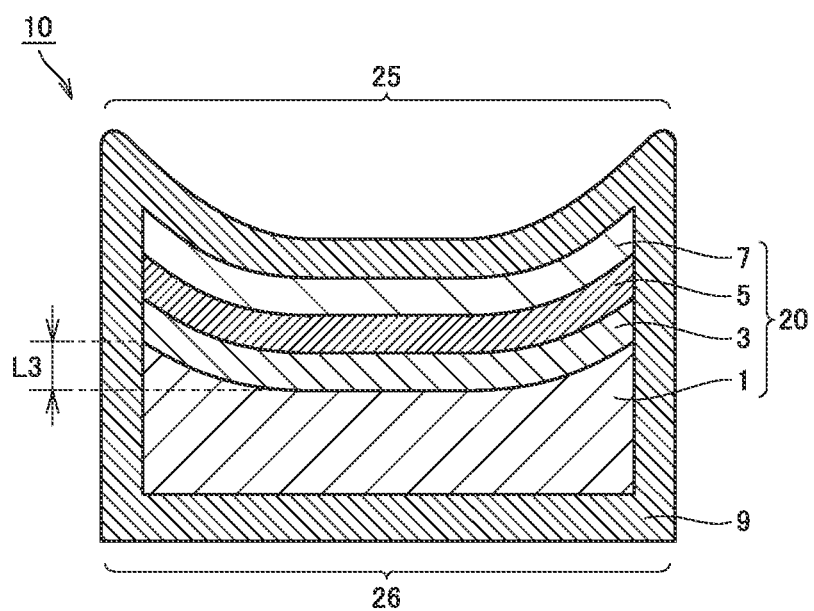
FIG. 20 is a schematic cross-sectional view for illustrating a superconducting wire in the seventh embodiment of the present invention.

On such a main surface of substrate 1, intermediate layer 3, superconducting material layer 5, and protective layer 7 are formed as shown in FIG. 19. The shape of respective upper surfaces of intermediate layer 3, superconducting material layer 5, and protective layer 7 is a concave shape conforming to the shape of the main surface of substrate 1. Consequently, multilayer stack 20 made up of substrate 1, intermediate layer 3, superconducting material layer 5, and protective layer 7 can be obtained as shown in FIG. 19. Next, stabilizing layer 9 is formed to surround multilayer stack 20 (see FIG. 20). Consequently, superconducting wire 10 can easily be obtained having front surface portion 25, which is the surface on the superconducting material layer 5 side, in the shape of a curved concave, as shown in FIG. 20. From superconducting wire 10 shown in FIG. 20, similar effects to those of the superconducting wire shown in FIG. 10 can be obtained as well.

Eighth Embodiment

Figure 21:
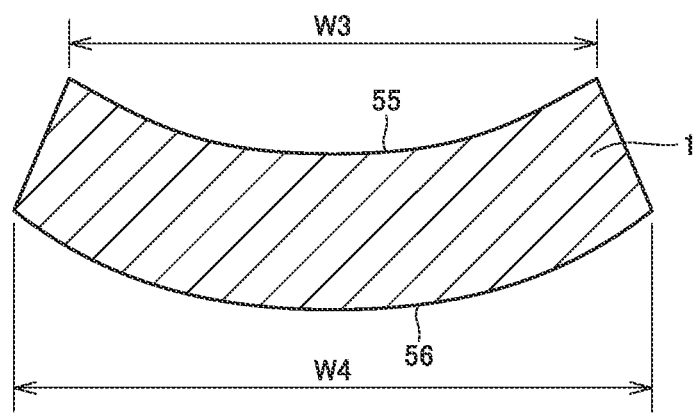
FIG. 21 is a schematic cross-sectional view for illustrating a method of manufacturing a superconducting wire in an eighth embodiment of the present invention.

FIG. 21 is a schematic cross-sectional view showing substrate 1 for forming a superconducting wire in an eighth embodiment of the present invention. Substrate 1 shown in FIG. 21 has width W3 of one main surface 55 and width W4 of the other main surface (back surface 56), and width W4 is larger than width W3. One main surface 55 of substrate 1 is a curved concave portion depressed inward in the thickness direction of substrate 1. The other main surface (back surface 56) is a curved convex portion protruding in the direction from the inside to the outside of substrate 1.

Figure 22:
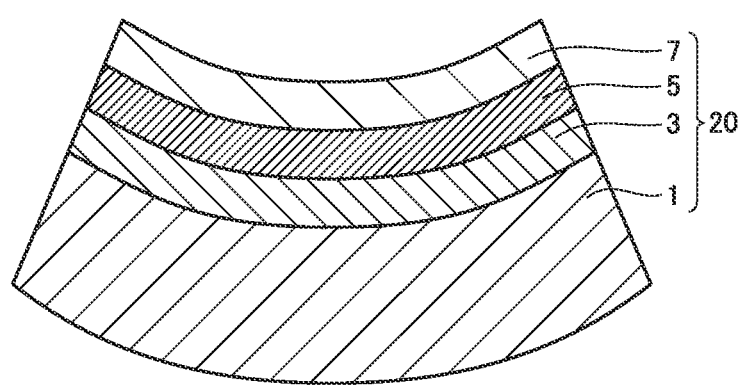
FIG. 22 is a schematic cross-sectional view for illustrating the method of manufacturing a superconducting wire in the eighth embodiment of the present invention.

On such one main surface 55 (main surface 55 which is a depressed curve) of substrate 1, intermediate layer 3, superconducting material layer 5, and protective layer 7 are formed as shown in FIG. 22. Consequently, multilayer stack 20 as shown in FIG. 22 can be obtained. Alternatively, intermediate layer 3, superconducting material layer 5, and protective layer 7 may be formed on one main surface of substrate 1 having a rectangular cross section, and thereafter conditions for wire thinning with slitter 30 shown in FIG. 7 may be adjusted to obtain multilayer stack 20 having the cross-sectional shape as shown in FIG. 22.

Figure 23:
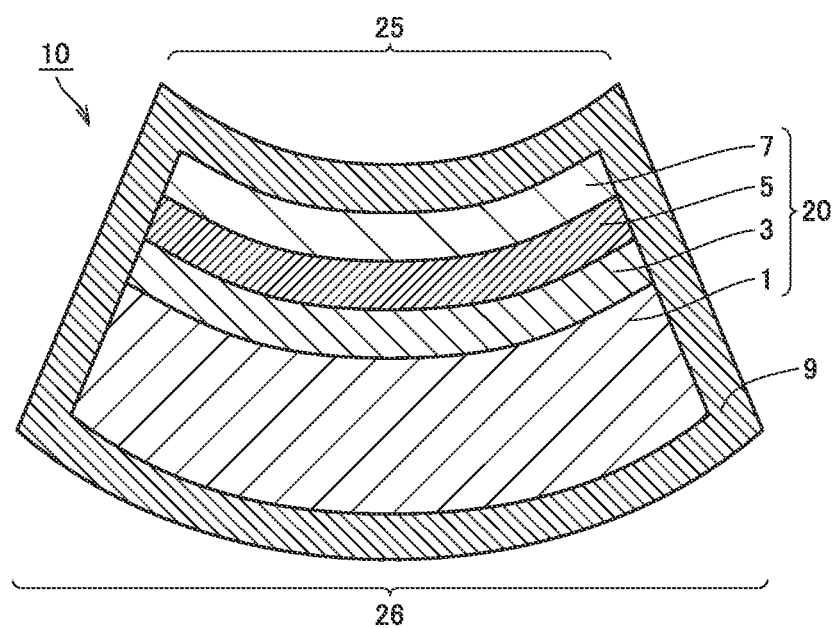
FIG. 23 is a schematic cross-sectional view for illustrating a superconducting wire in the eighth embodiment of the present invention.

Stabilizing layer 9 is formed around such multilayer stack 20 as shown in FIG. 23. Consequently, front surface portion 25 of stabilizing layer 9, which is the surface on the superconducting material layer 5 side, is a curved concave portion depressed along one main surface 55 of substrate 1 (or upper surface of protective layer 7). Meanwhile, back surface portion 26 of stabilizing layer 9 (surface of stabilizing layer 9 located to face back surface 56 of substrate 1) is a curved portion (convex portion) in the shape of a convex protruding outward from substrate 1. Regarding such superconducting wire 10, the width of back surface portion 26 of stabilizing layer 9 is larger than the width of front surface portion 25 of stabilizing layer 9, like superconducting wire 10 shown in FIG. 10. Thus, in the case where superconducting wire 10 is wound to form a multilayer structure, the probability of occurrence of a problem such as a scratch made on front surface portion 25 due to contact between a portion and an overlying portion of superconducting wire 10 in the multilayer structure can be reduced.

Figure 24:
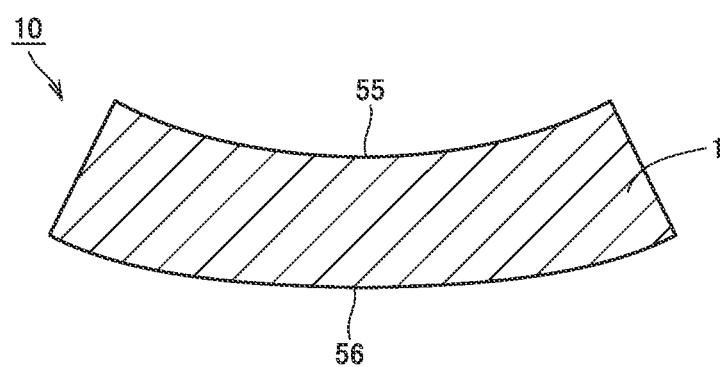
FIG. 24 is a schematic cross-sectional view for illustrating a method of manufacturing a modification of the superconducting wire in the eighth embodiment of the present invention.
Figure 25:
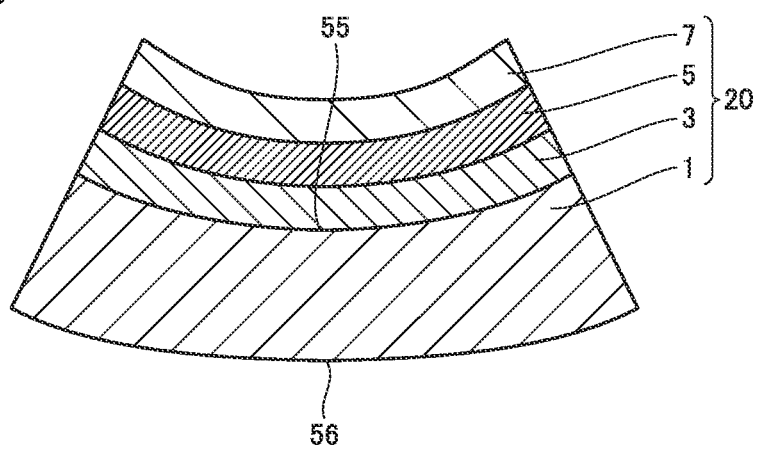
FIG. 25 is a schematic cross-sectional view for illustrating the method of manufacturing the modification of the superconducting wire in the eighth embodiment of the present invention.

Referring to FIG. 24, a modification of substrate 1 shown in FIG. 21 will be described. While substrate 1 shown in FIG. 24 has a configuration which is basically similar to that of substrate 1 shown in FIG. 21, the radius of curvature of back surface 56 of substrate 1 is larger than the radius of curvature of main surface 55 of substrate 1. On main surface 55 of substrate 1 configured in the above-described manner, intermediate layer 3, superconducting material layer 5, and protective layer 7 can be formed to obtain multilayer stack 20 as shown in FIG. 25. Then, the outer periphery of multilayer stack 20 can be covered with stabilizing layer 9 to obtain superconducting wire 10 as shown in FIG. 26.

Figure 26:
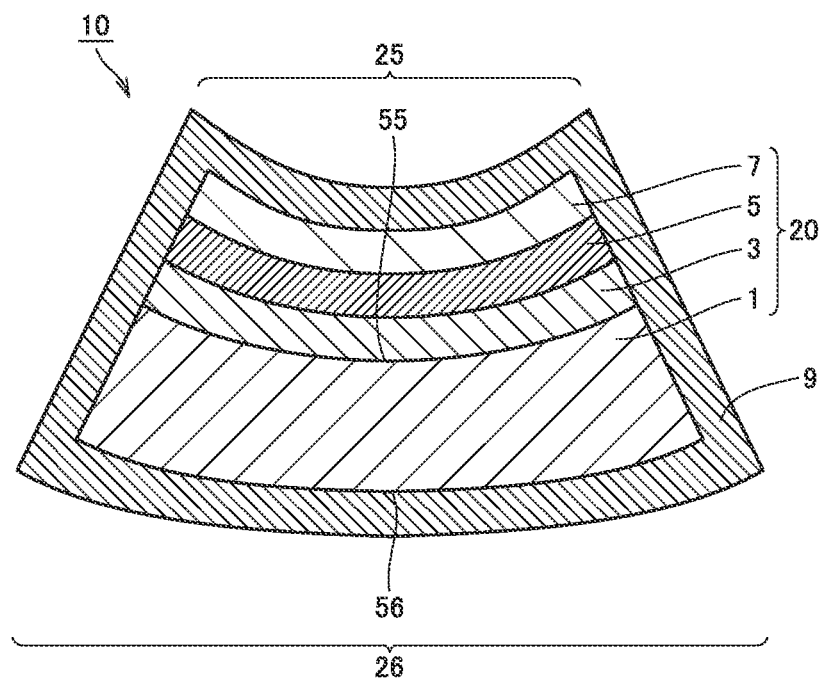
FIG. 26 is a schematic cross-sectional view for illustrating the modification of the superconducting wire in the eighth embodiment of the present invention.

Regarding superconducting wire 10 shown in FIG. 26, the shape of front surface portion 25 and the shape of back surface portion 26 of stabilizing layer 9 conform to the shape of main surface 55 and the shape of back surface 56 of substrate 1, respectively. Thus, the radius of curvature of back surface portion 26 is larger than the radius of curvature of front surface portion 25 of stabilizing layer 9. Consequently, from superconducting wire 10 shown in FIG. 26, similar effects to those of the superconducting wire shown in FIG. 9 can be obtained.

Superconducting wire 10 shown in FIG. 26 may be manufactured by a method according to which substrate 1 having the cross-sectional shape as shown in FIG. 24 is initially prepared, then intermediate layer 3, superconducting material layer 5, and protective layer 7 are formed on substrate 1 to form multilayer stack 20, and further stabilizing layer 9 is formed. Alternatively, intermediate layer 3, superconducting material layer 5, and protective layer 7 may be formed on the main surface of substrate 1 having a rectangular cross section, and thereafter conditions for wire thinning with slitter 30 shown in FIG. 7 may be adjusted to obtain multilayer stack 20 having the cross-sectional shape as shown in FIG. 25.

Ninth Embodiment

Figure 28:
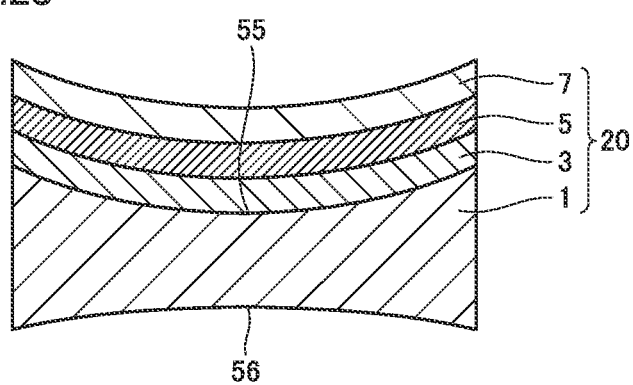
FIG. 28 is a schematic cross-sectional view for illustrating the method of manufacturing a superconducting wire in the ninth embodiment of the present invention.

FIG. 27 shows substrate 1 for forming a superconducting wire in a ninth embodiment of the present invention. Regarding substrate 1 shown in FIG. 27, main surface 55 and back surface 56 are each a concave curve depressed inward of substrate 1. On main surface 55 of substrate 1, intermediate layer 3, superconducting material layer 5, and protective layer 7 are formed as shown in FIG. 28. Consequently, multilayer stack 20 as shown in FIG. 28 is obtained. Then, stabilizing layer 9 is formed to cover the outer periphery of multilayer stack 20 as shown in FIG. 29. Consequently, superconducting wire 10 can be obtained having front surface portion 25 and back surface portion 26 of the stabilizing layer which are each in a curved shape depressed toward substrate 1. From superconducting wire 10 shown in FIG. 29, similar effects to those of the superconducting wire shown in FIG. 10 can be obtained as well. Moreover, regarding superconducting wire 10 shown in FIG. 29, back surface 56 of substrate 1 and the upper surface of protective layer 7 in multilayer stack 20 each have a curved shape depressed toward superconducting material layer 5. Therefore, stabilizing layer 9 can be formed along the surface of multilayer stack 20 to thereby easily form front surface portion 25 and back surface portion 26 which are each a depressed concave shape (curved shape). From superconducting wire 10 shown in FIG. 29, similar effects to those of superconducting wire 10 shown in FIG. 10 can be obtained as well.

It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

INDUSTRIAL APPLICABILITY

The present invention is advantageously applied particularly to a superconducting wire in which a superconducting material layer is formed on a surface of a substrate.

REFERENCE SIGNS LIST 1 substrate; 3 intermediate layer; 5 superconducting material layer; 7 protective layer; 9 stabilizing layer; 10 superconducting wire; 20, 20a, 20b multilayer stack; 21, 41, 51 apex; 23, 43, 53 bottom; 25 front surface portion; 26 back surface portion; 30 slitter; 31 rotary blade; 32 spacer; 55 main surface; 56 back surface

The invention claimed is:

1. A superconducting wire comprising:
   a multilayer stack including a substrate having a main surface, and a superconducting material layer formed on the main surface; and
   a covering layer disposed on at least the superconducting material layer,
   the covering layer located on the superconducting material layer having a front surface portion in a concave shape.

2. The superconducting wire according to claim 1, wherein
   in a cross section in a width direction of the substrate, a distance in a thickness direction of the substrate between an apex and a bottom of a region in the concave shape of the front surface portion is not less than 1 μm and not more than 100 μm.

3. The superconducting wire according to claim 1, wherein
   in a cross section in a width direction of the substrate, the front surface portion is smaller in width than a region of the superconducting wire located opposite to the front surface portion.

4. The superconducting wire according to claim 1, wherein
   a back surface portion of the superconducting wire located opposite to the front surface portion has one of a flat shape and a concave shape.

5. The superconducting wire according to claim 1, wherein
   a back surface portion of the superconducting wire located opposite to the front surface portion is curved in a convex shape,
   the front surface portion is curved in a concave shape, and
   in a cross section in a width direction of the substrate, the back surface portion is larger in radius of curvature than the front surface portion.

6. The superconducting wire according to claim 1, wherein
   in a cross section in a width direction of the substrate, the covering layer on an end of the superconducting material layer is larger in thickness than the stabilizing layer on a central portion of the superconducting material layer.

* * * * *